US012811575B2

(12) United States Patent
Nerad

(10) Patent No.: US 12,811,575 B2
(45) Date of Patent: Nov. 24, 2026

(54) GAIN AND BANDWIDTH CONTROL LOOP FOR ELECTROSTATIC SIGNAL RECEIVER

(71) Applicant: EM MICROELECTRONIC-MARIN S.A., Marin (CH)

(72) Inventor: Jiri Nerad, Prague (CZ)

(73) Assignee: EM MICROELECTRONIC-MARIN SA, Marin (CH)

( * ) Notice: Subject to any disclaimer, the term of this patent is extended or adjusted under 35 U.S.C. 154(b) by 2 days.

(21) Appl. No.: 18/917,394

(22) Filed: Oct. 16, 2024

(65) Prior Publication Data

US 2025/0219628 A1 Jul. 3, 2025

(30) Foreign Application Priority Data

Dec. 27, 2023 (EP) .................................... 23220385

(51) Int. Cl.
*H03K 5/13* (2014.01)
*H03K 5/134* (2014.01)
*H03K 5/135* (2006.01)

(52) U.S. Cl.
CPC ............ *H03K 5/134* (2014.07); *H03K 5/135* (2013.01)

(58) Field of Classification Search
CPC .. H03K 5/01; H03K 5/02; H03K 5/12; H03K 5/13; H03K 5/133; H03K 5/134; H03K 5/135; H03K 5/153; H03K 5/1534; H03K 2005/00293
See application file for complete search history.

(56) References Cited

U.S. PATENT DOCUMENTS 10,088,510 B2 10/2018 Sawataishi
2014/0035601 A1* 2/2014 Fujiyoshi ............ G06F 3/04182 324/684
2014/0077882 A1 3/2014 Draxelmayr et al.

OTHER PUBLICATIONS

European Search Report for European Application No. 23 22 0385 dated Jun. 11, 2024.

* cited by examiner

*Primary Examiner* — Long Nguyen
(74) *Attorney, Agent, or Firm* — Sughrue Mion, PLLC

(57) ABSTRACT

An analog circuit (1) including: a signal input (VSIG) to provide an input signal via capacitive coupling, an edge detection stage (10) operable to detect rising and falling edges of the input signal provided at the signal input (VSIG), an amplifier stage with continuously variable gain and bandwidth (30) between the signal input (VSIG) and the edge detection stage (10) and operable to amplify the input signal provided by the signal input (VSIG).

15 Claims, 4 Drawing Sheets

GAIN AND BANDWIDTH CONTROL LOOP FOR ELECTROSTATIC SIGNAL RECEIVER

CROSS REFERENCE TO RELATED APPLICATIONS

This application claims priority to European Patent Application No. 23220385.1, filed on Dec. 27, 2023, the disclosures of which are incorporated by reference herein their entireties

FIELD OF THE INVENTION

In one aspect the present invention relates to an analog circuit to process capacitively coupled input signals. In another aspect the present invention relates to an electrostatic position indicator, such as an electronic pen or pencil, comprising an electrode configured to receive an input signal by capacitive coupling with a touch sensitive display of an electronic device.

BACKGROUND

Typical electrostatic signal receiver architectures used in currently available stylus or electronic pen products are known for instance from US 2018/0095495 A1. This document describes a system with edge detection performed by a straightforward analog topology using analog RC high pass filters and voltage comparators with adaptive voltage levels. Document EP 3 968 132 A1 describes a system with edge detection performed by a complex switched capacitor topology derived from the so-called sigma delta architecture.

Prior art systems for electrostatic signal reception do not allow for continuous and simultaneous control of the gain and bandwidth of the front stages of the receiver, which front stages typically comprise a preamplifier and a filter.

Here, a simultaneous control is not supported because, normally, two degrees of freedom are required to control the gain and bandwidth of the front stages independently.

Also, a continuous control is not supported because low noise amplifier stages require capacitive feedback. Currently available implementations of floating variable capacitors with continuous control are not practical or feasible.

Also, continuous control of gain or bandwidth is not possible in prior art systems because, in those designs, both quantities are selected or decided by firmware.

Consequently, the use of discrete control brings signal disruption during adjustments to the gain or bandwidth while the use a firmware results in limited speed of the feedback system, preventing appropriate reaction to fast signal fading.

Generally, and when performing analog edge detection, that is, extracting edge time information, the analog input signal is converted into two digital output streams where a rising edge on the analog input triggers a pulse on the positive digital output and wherein a falling edge on the analog input triggers a pulse on the negative digital output, and the delay from an edge on an analog input to the start of the respective pulse on a digital output is stable with time.

Such digital data streams are typically processed with a matched filter calculating values of correlation between the received timing sequence and the expected (template) timing pattern over a sliding time window.

A key problem to address in such architecture is the fact that analog edge detection techniques can only provide low error rate and stable delay (latency) if the analog input signal amplitude is maintained in a certain dynamic range. Therefore, appropriate signal voltage amplification has to be provided.

Another problem to address is the presence of low frequency interference. A standard technique to suppress such interfering signals is placing a high pass filter with programmable corner frequency before the edge detection stage. The properties of the digital streams generated by the edge detection block can be used to determine if the input signal amplitude is below, above or within the optimum dynamic range for detection.

Specifically, for weak input signals near the minimum detection amplitude, the output pulses of the edge detection stage are very short and the combined duty cycle is near zero. Poor receive performance can be expected under these conditions as the edge detection delay, i.e. the latency, tends to vary with time.

Reliable edge detection with stable delay or latency is typically obtained for moderate input amplitudes where the output pulse duration is a fraction of the time spacing between the input signal edges, and consequently, the output duty cycle is neither close to zero nor one.

Rather strong input signals result in very long output pulses that span almost the entire time interval between the related opposite edges of the input signal, thus leading to an output duty cycle of almost one. Even though such output may still allow for a reliable detection, it typically indicates an overdrive or clipping condition that most system designs try to avoid.

The same principles and shortcomings also apply if discrete time implementations are used, e.g., a switched capacitor topology derived from a sigma delta architecture. Here, the output signals are clocked and can only change at discrete time points.

With such system and principles known so far, the control loop is rather slow and cannot handle fast signal fading. Moreover, a gain adjustment or a corner frequency adjustment may result in operating point disruptions.

SUMMARY OF THE INVENTION

In one aspect, there is provided an analog circuit. The analog circuit comprises a signal input to provide an input signal via a capacitive coupling. The signal input may be capacitively coupled to an electrode of a position indicator, such as a pen or pencil configured for use with an electronic display, e.g., with a touch sensitive electronic display of a tablet computer or smartphone.

The analog circuit further comprises an edge detection stage, which is operable to detect rising and falling edges of the input signal, which is provided at the signal input. The analog circuit further comprises an amplifier stage with continuously variable gain and bandwidth between the signal input and the edge detection stage. The amplifier stage with continuously variable gain and bandwidth is operable to amplify the input signal provided by the signal input. An amplifier stage with continuously variable gain and bandwidth may provide a single and continuous control quantity for a front stage of the analog circuit, which means that a single degree of freedom is simultaneously used to control both gain and bandwidth of the amplifier stage with continuously variable gain and bandwidth. This may also have a side effect on a high pass corner frequency and an input referred noise, however, with no negative impact on system performance.

By way of an amplifier stage with continuously variable gain and bandwidth between the signal input and the edge detection stage, there can be provided a rather fast and continuous gain and bandwidth control for the signal input provided to the edge detection stage.

According to a further example, the amplifier stage with continuously variable gain and bandwidth is a voltage controllable amplifier stage with continuously variable gain and bandwidth. The amplifier stage with continuously variable gain and bandwidth is controllable by a loop control voltage, which is derivable from at least one output of the edge detection stage. In this way, there may be provided a feedback loop for the edge detection stage.

The loop control voltage is derivable from at least one or several outputs of the edge detection stage. Depending on the output of the edge detection stage the loop control voltage is generated and used as a control signal for the voltage controllable amplifier stage with continuously variable gain and bandwidth. In this way there can be provided a rather fast control loop, which operates continuously.

According to a further example the analog circuit comprises a differential integrator stage connected to at least one output of the edge detection stage. The differential integrator stage is operable to derive the loop control voltage from at least one output or from several outputs of the edge detection stage. The differential integrator stage may be particularly operable to process an input signal derivable from a first output of the edge detection stage and from a second output of the edge detection stage.

According to a further example the differential integrator stage comprises an operational amplifier with a first integrator input, a second integrator input and an integrator output. The first integrator input is connected to a reference voltage. The second integrator input is coupled to at least one output of the edge detection stage.

According to a further example, the integrator output is connected to the second integrator input via a first local feedback branch. Insofar, the operational amplifier of the differential integrator stage may be configured as a negative feedback loop. In some examples, the reference voltage may be connected to the non-inverting input of the operational amplifier and the second integrator input is an inverting input of the operational amplifier.

According to a further example, the first local feedback branch of the differential integrator stage comprises an integration capacitor.

Typically, the output of the operational amplifier is connected to a control input of the amplifier stage with continuously variable gain and bandwidth. The loop control voltage for the variable gain variable bandwidth amplifier stage may be provided at the output of the operational amplifier of the differential integrator stage.

According to a further example, the analog circuit, specifically the differential integrator stage, further comprises a second local feedback branch parallel to the first local feedback branch. The second local feedback branch may comprise a feedback resistor. By way of a feedback resistor the differential integrator stage can be implemented as a lossy integrator stage.

Use or implementation of a lossy integrator in the differential integrator stage and hence in the gain and bandwidth control loop offers a fast loop reaction to variations of signal strength at the expense of smaller static gain of the entire loop. This means that the loop can accommodate larger variation of the resulting digital activity as the input signal strength moves between minimum and maximum. The integrator type and the optimum combination of the related design parameters are application dependent and have to be determined on a case-by-case basis to suit both the full dynamic range and the amplitude ramp speed of the input signal provided at the signal input.

According to a further example, the analog circuit comprises a logic gate, e.g., the analog circuit comprises one of a logic OR gate and logic NOR gate. The logic gate has a first gate input connected to a first output of the edge detection stage. The logic gate further has a second gate input connected to a second output of the edge detection stage. According to a further example the one of the logic gate, i.e. one of the OR gate and the NOR gate comprises a gate output connected to the second integrator input of the operational amplifier.

According to a further example, the analog circuit further comprises an integration resistor between the gate output of the logic OR gate or logic NOR gate and the second integrator input of the operational amplifier. This way and with the first local feedback branch comprising the integration capacitor, an integration time constant of the differential integrator stage can be determined by the product of the integration resistance of the integration resistor and the integration capacitance of the integration capacitor. It can be designed to obtain a desired tradeoff between the feedback loop speed and the loop control voltage ripple.

According to a further example, the amplifier stage with continuously variable gain and bandwidth comprises an amplifier with an amplifier input connected to the signal input and an amplifier output connected to the edge detection stage. The amplifier stage with continuously variable gain and bandwidth further comprises a first amplifier branch. The first amplifier branch comprises a feedback capacitor parallel with the amplifier input and the amplifier output.

The amplifier stage with continuously variable gain and bandwidth further comprises a second amplifier branch comprising a feedback resistance parallel to the first local feedback branch and/or parallel with the amplifier input and the amplifier output.

The feedback resistance may be variable. It may be variable by the loop control voltage as provided by the differential integrator stage. By varying the feedback resistance the signal transfer properties of the amplifier stage with continuously variable gain and bandwidth can be modified. Generation and modification of the control feedback resistance may be provided by a combination of a fixed resistor and a transistor operated in a triode region as a controlled resistance. Unlike controlled linear capacitors, such a combination is easy to implement in CMOS technology.

According to a further example, the feedback resistance is controllable by a loop control voltage. Typically, the loop control voltage is derived from at least one output of the edge detection stage.

Furthermore, and according to another example, the second amplifier branch is connected to the integrator output. The feedback resistance is controllable by the loop control voltage provided at the integrator output. In this way there can be provided an effective feedback loop for the amplifier stage with continuously variable gain and bandwidth.

According to another aspect, the present invention further relates to a position indicator. The position indicator may be implemented as a pencil, e.g. as an electrostatic pen or pencil configured to capacitively interact with an electronic display, e.g., with a touch sensitive electronic display of a mobile electronic device, such as a tablet computer or a smart phone.

The position indicator comprises an electrode configured to receive an input signal by capacitive coupling, e.g. by capacitive coupling to a capacitive area of a touch sensitive display. The position indicator further comprises an analog circuit as described above, wherein the signal input of the analog circuit is connected to the electrode of the position indicator.

BRIEF DESCRIPTION OF THE DRAWINGS

In the following numerous examples of the invention will be described in greater detail by making reference to the drawings, in which.

DETAILED DESCRIPTION

Figure 1:
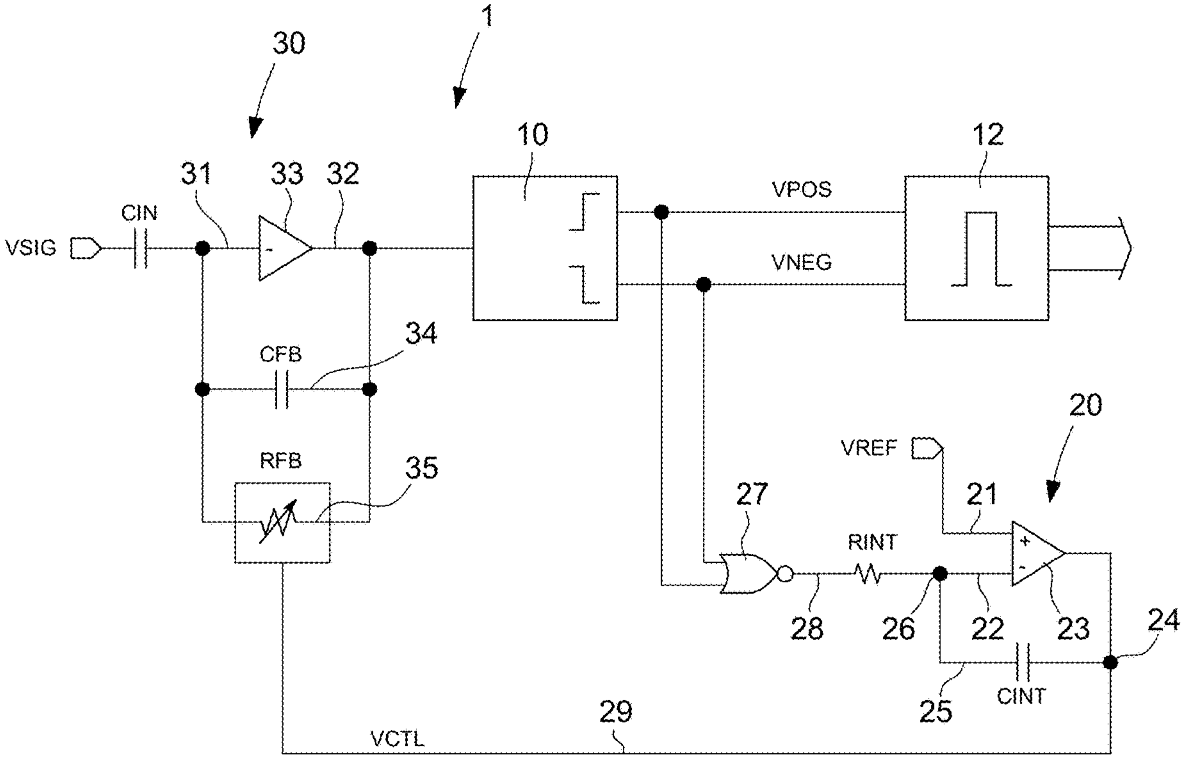
FIG. 1 shows a block diagram of an example of the analog circuit.

The analog circuit 1 as shown in FIG. 1 comprises a signal input VSIG, which is coupled or connected to an electrode of a pen or pencil via a capacitive coupling. The signal input VSIG is connected by an input capacitor CIN to a variable gain variable bandwidth amplifier stage 30. An amplifier output 32 of the variable gain variable bandwidth amplifier stage 30 is connected to an edge detection stage 10. The edge detection stage 10 provides a digital data stream at its two outputs VPOS and VNEG, respectively. A rising edge on the analog input triggers a pulse on the positive digital output VPOS and a falling edge on the analog input triggers a pulse on the negative digital output VNEG.

The edge detection circuit 10 with its two digital outputs VPOS and VNEG is connected to a correlator 12, that provides a data output to be processed by a digital logic of the pen or pencil.

The analog circuit 1 further comprises a differential integrator stage 20, which is connected to both outputs VPOS and VNEG of the edge detection stage 10. The differential integrator stage 20 is connected to a control input of the amplifier stage with continuously variable gain and bandwidth 30. In the illustrated examples the differential integrator stage 20 comprises an operational amplifier 23 comprising a first integrator input 21 connected to a reference voltage VREF.

The operational amplifier 23 further comprises a second integrator input 22, which is connected to a logic gate 27. Specifically, the second integrator input 22 is connected to an output of the logic gate 27. First and second inputs of the logic gate 27 are connected to first and second outputs VPOS and VNEG of the edge detection stage 10, respectively. The first integrator input 21 may be a non-inverting input of the operational amplifier 23. The second input 22 of the operational amplifier 23 may be an inverting input. The output 24 of the operational amplifier 23 may be connected via a control line 29 to a control input of the amplifier stage with continuously variable gain and bandwidth 30. This way, there can be provided a voltage-controlled negative feedback loop.

The operational amplifier 23 is further provided with a first local feedback branch 25 connecting the integrator output 24 with the second integrator input 22, the latter of which may be implemented as the inverting input of the operational amplifier 23. The first local feedback branch 25 is further provided with an integration capacitor CINT.

Figure 5:
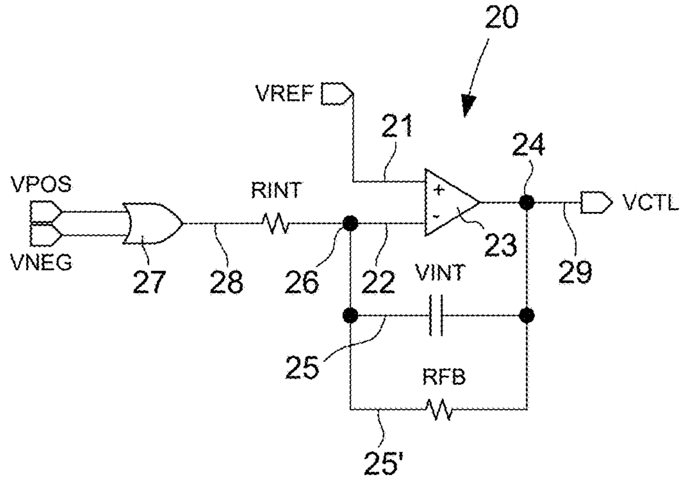
FIG. 5 shows a block diagram of a lossy integrator circuit as an alternative to lossless integrators used in the examples of FIG. 1 and FIG. 3.

The local feedback branch 25 is connected to a node 26, which node 26 is connected to the second integrator input 22. Between the node 26 and an output 28 of the logic gate 27 there is provided an integration resistor RINT. In variant of the differential integrator stage 20 as shown in FIG. 5 there is provided an optional second local feedback branch 25'. The second local feedback branch 25' is connected in parallel to the first local feedback branch 25. The second local feedback branch 25' may be provided with a feedback resistor RFB. In this way, there is provided a kind of a lossy integrator, where the feedback resistor limits a static gain of the integrator stage.

Figure 3:
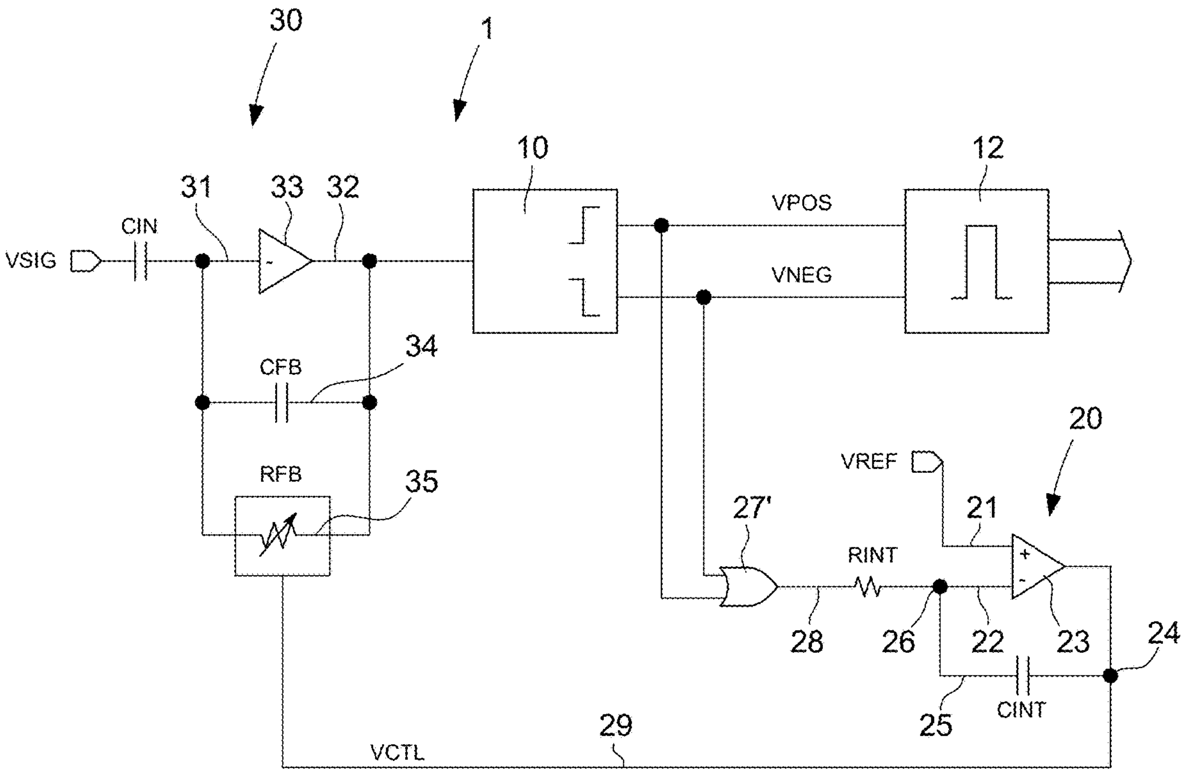
FIG. 3 shows another example of the analog circuit according to the present invention.

In contrast to a lossless design as shown in FIG. 1 or 3 the use of the lossy integrator in the proposed gain and bandwidth control loop offers a fast reaction to the variations of signal strength at the expense of smaller static gain of the entire loop. This may lead to rather large variations of the resulting digital activity as the input signal strength moves between its minimum and its maximum. The integrator type and the optimum combination of the related design parameters are application-dependent and have to be determined or derived on a case-by-case basis to suit both the full dynamic range and the amplitude ramp speed of the input signal as provided at the signal input VSIG.

The amplifier stage with continuously variable gain and bandwidth 30 is voltage controllable, e.g. via a voltage control VCTL signal obtained at the output 24 of the operational amplifier 23. The integrator output 24 is connected to a control input of the amplifier stage with continuously variable gain and bandwidth 30 via a control line 29.

The amplifier stage with continuously variable gain and bandwidth 30 comprises an amplifier 33 with an amplifier input 31 and an amplifier output 32. The amplifier input 31 and the amplifier output 32 are connected by a first amplifier branch 34 in parallel with the amplifier 33. The amplifier input 31 and the amplifier output 32 are further connected via a second amplifier branch 35 in parallel to the first amplifier branch 34. The first amplifier branch 34 comprises a feedback capacitor CFB. The second amplifier branch 35 is provided with a variable feedback resistor RFB. The resistance of the variable feedback resistor RFB can be controlled by the loop control voltage VCTL as provided via the control line 29.

Figure 2:
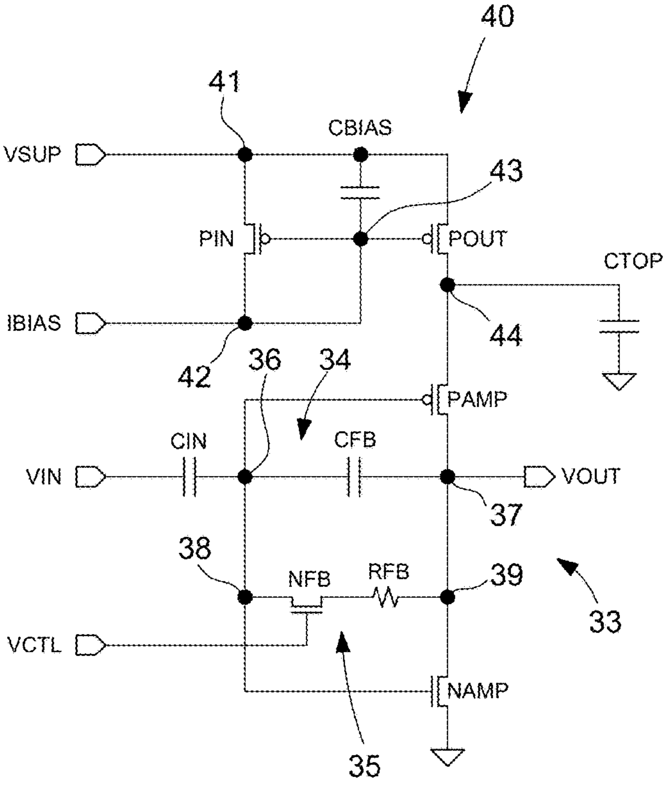
FIG. 2 shows a block diagram of further details of the amplifier stage with continuously variable gain and bandwidth according to FIG. 1.

In FIG. 2 an example of an internal structure of the amplifier stage with continuously variable gain and bandwidth 30 is illustrated in more detail. Specifically, the amplifier 33 comprises a PMOS transistor PAMP and a NMOS transistor NAMP connected in series. Here, a drain of the transistor PAMP is connected to a drain of the transistor NAMP. The source of the transistor NAMP is connected to ground.

The source of the transistor PAMP is connected to a biasing branch 40. Between the transistors NAMP and PAMP, specifically between the drain of the transistor PAMP and the drain of the transistor NAMP there is provided the amplifier output 32 as indicated in FIG. 1, where an amplified voltage VOUT can be provided. As illustrated, there is provided an output node 37 connected to the amplifier output 32 and connected to both the drain of the transistor PAMP and the drain of the transistor NAMP.

The amplifier input 31 as indicated in FIG. 1 in simplified form comprises an input node 36. The input node 36 is connected to one side of an input capacitor CIN. A second side of the input capacitor CIN is connected to the signal input VSIG as indicated in FIG. 1, where an input voltage VIN can be provided, which can be capacitively coupled to a display of an electronic device. The input node 36 is further connected to one side of the feedback capacitor CFB. Another side of the feedback capacitor CFB is connected to an output node 37. The input node 36 and the output node 37 are mutually connected via the first local feedback branch 34. The feedback capacitor CFB is located on the first local feedback branch 34.

The second local feedback branch 35 is provided with a NMOS transistor NFB in series with a fixed feedback resistor RFB. The second local feedback branch 35 terminates at one end with a further input node 38 and terminates at an opposite end with a further output node 39. The further input node 38 is connected to the input node 36. The further output node 39 is connected to the output node 37. This way, the first local feedback branch 34 is parallel to the second local feedback branch 35. The further output node 39 is connected to the drain of the transistor NAMP and the drain of the transistor PAMP.

A source of the transistor NFB is connected to the further input node 38 and a drain of the transistor NFB is connected to the resistor RFB. The loop control voltage VCTL and hence the feedback line 29 is connected to the gate of the transistor NFB.

In this way, the overall resistance of the second local feedback branch 35 can be continuously regulated and controlled by the loop control voltage VCTL, which is provided by the differential integrator stage 20.

With the example of FIGS. 1 and 2, the logic gate 27 is a logic NOR gate and the second local feedback branch 35 comprises a NMOS type transistor NFB.

Figure 4:
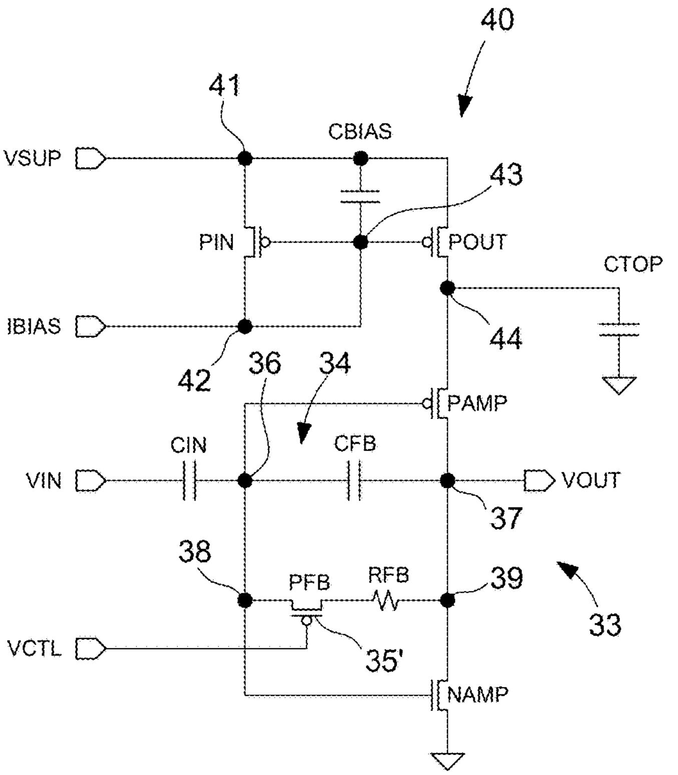
FIG. 4 shows a block diagram of the amplifier stage with continuously variable gain and bandwidth of the example of FIG. 3.

With the alterative example of FIGS. 3 and 4, the logic gate 27' is an OR gate and the transistor PFB of the second local feedback branch 35' is a PMOS type transistor.

Both examples as illustrated in FIGS. 1-4 provide the same or like functionality and the remaining components of the differential integrator stage 20 and of the amplifier stage with continuously variable gain and bandwidth 30 are substantially identical or have the same or corresponding function.

The biasing branch 40 of the amplifier stage 30 comprises a voltage supply input VSUP and a bias current input IBIAS. The voltage supply input VSUP is connected to a node 41 and the bias current input IBIAS is connected to another node 42. The two nodes 41, 42 are connected by an input transistor PIN, e.g., implemented as a PMOS transistor. The source of the input transistor PIN is connected to the node 41. The drain of the input transistor PIN is connected to the node 42.

The biasing branch 40 further comprises an output transistor POUT, e.g., implemented as a PMOS transistor. The gate of the input transistor PIN and the gate of the output transistor POUT are mutually connected. Between the gate of the input transistor PIN and the gate of the output transistor POUT there is provided a node 43. The node 43 is connected to one side of a bias capacitor CBIAS. Another side of the bias capacitor CBIAS is connected to the node 41. The node 43 is further connected to the node 42.

A drain of the output transistor POUT is connected to a further node 44, which is connected to the source of the transistor PAMP. The node 44 is also connected to ground via another capacitor CTOP. The transistor POUT of the bias branch 40 is in series with the transistor PAMP and further with the transistor NAMP. In this way, the bias branch 40 is operable to provide a suitable bias current for the amplifier stage with continuously variable gain and bandwidth 30.

In operation, the differential integrator stage 20, specifically its operational amplifier 23 steers its output VCTL to obtain a virtual zero, or a zero differential voltage between its non-inverting input 21 and inverting input 22. Accordingly, and when a digital activity on the two outputs of the edge detection stage 10 and hence on the digital streams VPOS and VNEG is too low or comparatively low, the differential integrator stage 20 steers the loop control voltage VCTL to increase the gain of the amplifier stage with continuously variable gain and bandwidth 30, e.g. acting as a front stage for the edge detection stage 10.

Conversely, and when the digital activity is too high or comparatively large, the differential integrator stage 20 is operable to reduce the gain of the front stage, i.e. the gain of the amplifier stage with continuously variable gain and bandwidth 30.

In both cases, the functionality of the differential integrator stage 20 provides that the loop control voltage VCTL continues to increase or decrease until the combined duty cycle of the output of the edge detection stage 10 approaches or equals a target set by the reference voltage VREF.

The integration time constant is determined by the product of the integration resistance RINT and the integration capacitance CINT and can be designed to obtain the desired tradeoff between feedback loop speed and loop control voltage ripple.

The signal transfer properties of the amplifier stage with continuously variable gain and bandwidth 30 or front gain stage are controlled by varying a local feedback resistance, i.e. the resistivity of the feedback resistor RFB as indicated in FIGS. 1 and 3, or, more practically, by the combination of a fixed resistor RFB and a transistor NFB or PFB as shown in FIGS. 2 and 4, which transistor NFB, PFB is operated in triode region as a controlled resistance. Unlike controlled linear capacitors, such combination is easy to implement in CMOS technologies.

In situation with a comparatively low or weak input signal at VSIG the gain control mechanism uses a maximum value or a comparatively high value of local feedback resistance to maximize the gain. Consequently, the effect of the local feedback resistance is minimized, and the local feedback in the gain amplifier stage 30 or front stage becomes capacitive via CIN and CFB. Therefore, the input noise of the gain stage is not degraded and the minimum detectable signal performance is maintained.

In other situation, and with a comparatively strong input signal at VSIG, the gain control mechanism uses a low value of local feedback resistance to minimize the gain. This increases the bottom corner frequency of the variable gain variable bandwidth amplifier stage 30 stage. Here, and in this configuration, the variable gain variable bandwidth amplifier stage 30 may act as a high-pass filter.

More precisely, the amplifier stage 30 always acts as a bandpass where the bottom corner frequency is given by the combination of the local feedback resistance RFB and the feedback capacitance CFB while the top corner frequency is given by a loading effect at the output of the variable gain variable bandwidth amplifier 30 and is primarily determined by the load capacitance and available power. The variable gain variable bandwidth amplifier stage 30 design for the reception of square wave patterns is generally wideband and the value of the top corner frequency need not be considered here. What is of main interest is the high pass effect related to the variable bottom corner frequency of the variable gain variable bandwidth amplifier 30.

This may provide improved suppression of a low frequency interference, whilst there is no adverse effect on edge detection.

Figure 6:
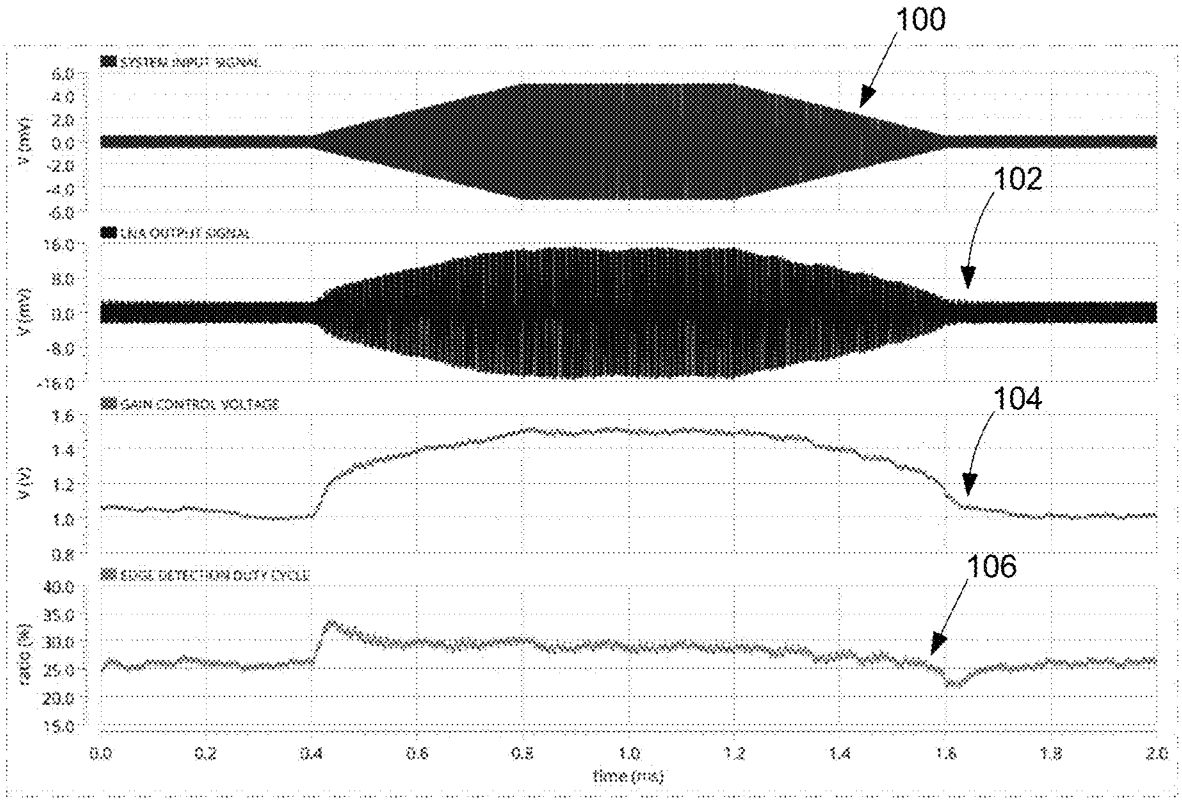
FIG. 6 is a diagram of numerous signals arising at different locations of the analog circuit during operation of the analog circuit.

FIG. 6 gives an example of system operation during a rapid signal amplitude increase and decrease at system input 100, showing the resulting signal waveform 102 at the output of the variable gain variable bandwidth and low noise amplifier stage 30. The change of the related loop control voltage is shown in graph 104 and the moving average of the combined duty cycle of the output digital streams as provided at the output 28 of the logical gate 27, 27' is shown in graph 106. While the input signal amplitude increases or decreases ten times in 400 microseconds, the duty cycle is maintained between 25% and 30% most of the time, and between 21% and 34% at all times. As expected, the extreme values of duty cycle are observed during the reception of minimum signal with varying amplitude.

Figure 7:
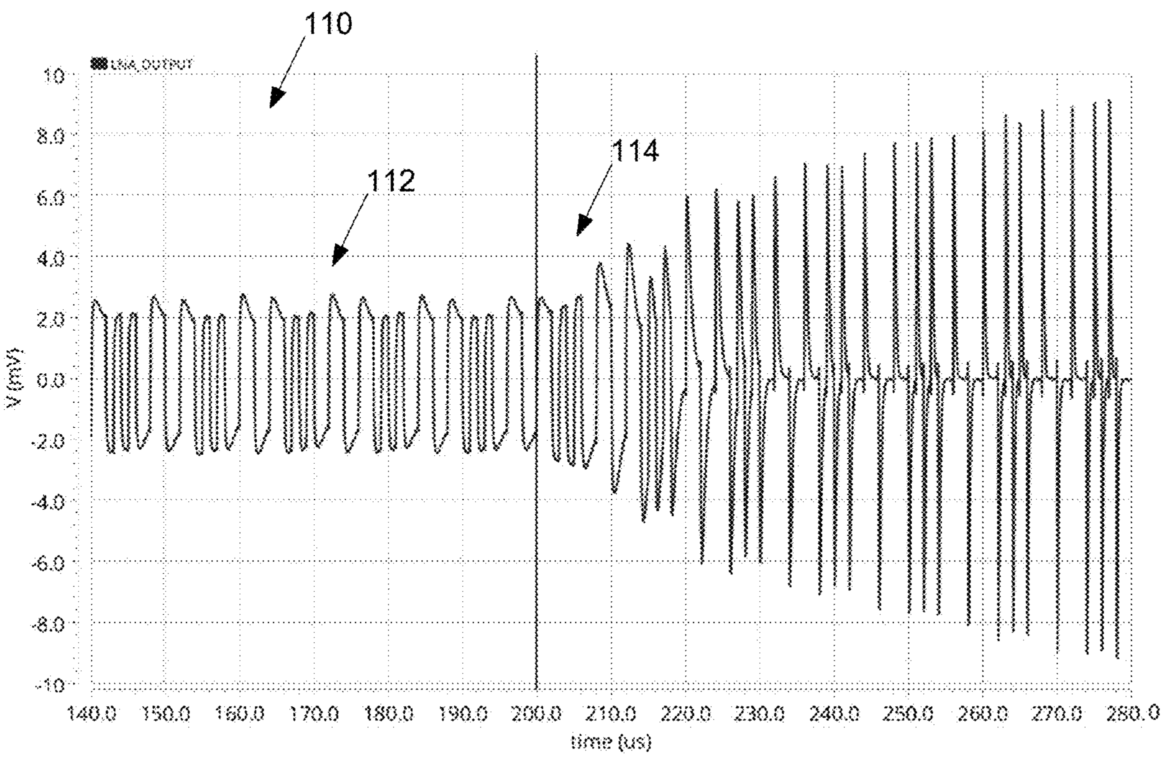
FIG. 7 shows an example waveform of the variable gain amplifier signal output for steep increase of input signal amplitude, e.g. near a minimum detectable signal strength.

FIG. 7 shows a detailed view of the signal shape 110 at the output of the variable gain variable bandwidth amplifier stage 30. For the minimum input signal indicated with arrow 112, the signal is amplified but not filtered in order to maximize its power for subsequent edge detection. For the increasing input signal strength as indicated with arrow 114, the signal amplification is reduced and the low frequency part of its spectrum is removed, obtaining a high pass type signal shape suitable for most edge detector types.

Figure 8:
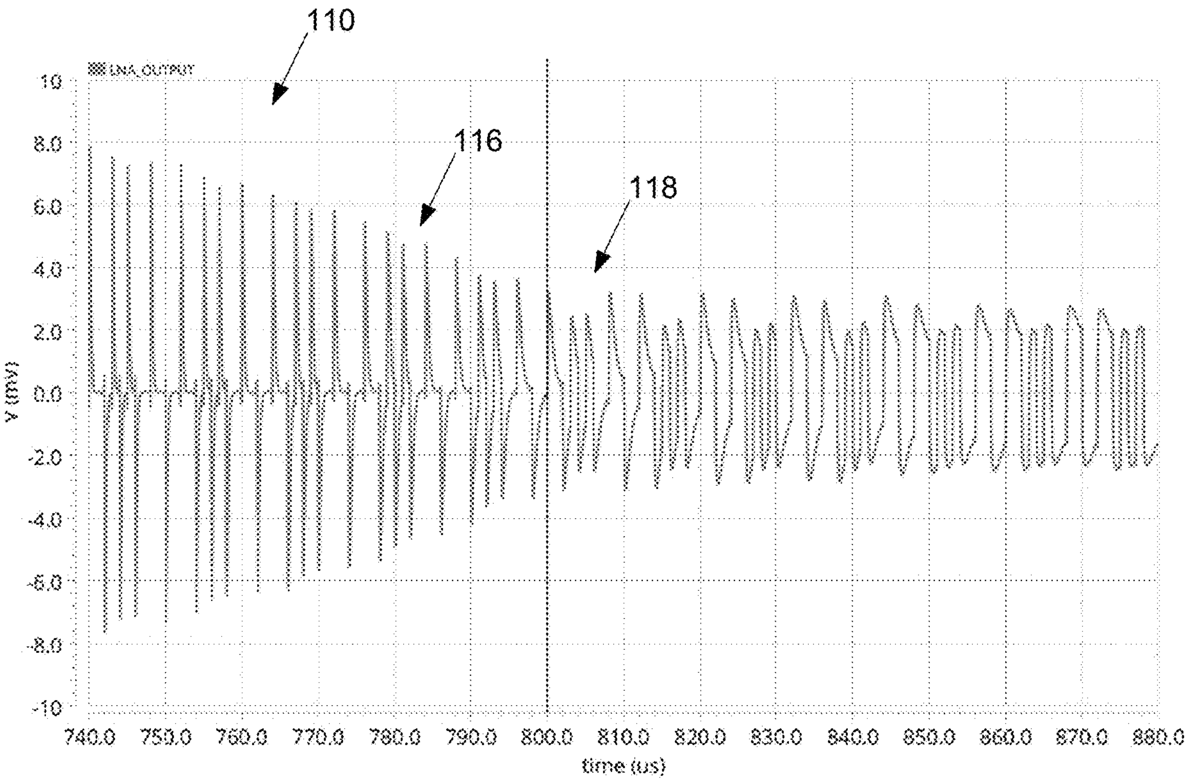
FIG. 8 shows an example waveform of the variable gain amplifier signal output for steep decrease of input signal amplitude, e.g. near a minimum detectable signal strength.

Conversely, FIG. 8, shows another detailed view of the signal shape 110 at the output of the variable gain variable bandwidth amplifier stage 30 of the system operation as the ramp down ends, which is indicated with arrow 116 and the input signal strength returns to its minimum starting at the arrow 118. As the signal power decreases, the operation of the variable gain variable bandwidth amplifier stage 30 shifts from a low gain high pass type to a high gain wideband amplifier type. The adjustment is continuous, without delay.

The proposed invention supports continuous and simultaneous control of the gain and bottom corner frequency of the variable gain variable bandwidth amplifier stage 30 and hence of the front end stages, bringing fast adjustments during input signal fading without signal disruption due to discrete changes to the gain or corner frequency while retaining low noise operation during weak signal reception on one side and low frequency interference suppression during strong signal reception on the other.

NOMENCLATURE

1 circuit
10 edge detection stage
12 correlator
20 differential integrator stage
21 integrator input
22 integrator input
23 operational amplifier
24 integrator output
25 local feedback branch
26 node
27 logic gate
28 gate output
29 control line
30 variable gain variable bandwidth amplifier stage
31 amplifier input
32 amplifier output
33 amplifier
34 amplifier branch
35 amplifier branch
36 node
37 node
38 node
39 node
40 biasing branch
41 node
42 node
43 node
44 node

The invention claimed is:

1. An analog circuit comprising:

a signal input configured to provide an input signal via capacitive coupling;

an edge detection stage configured to detect a rising edge and a falling edge of the input signal provided at the signal input; and an amplifier stage with continuously variable gain and bandwidth, the amplifier stage coupled between the signal input and the edge detection stage and configured to amplify the input signal provided by the signal input, wherein the amplifier stage with continuously variable gain and bandwidth is a voltage controllable amplifier stage with continuously variable gain and bandwidth, which is controllable by a loop control voltage derived from at least one output of the edge detection stage, wherein the analog circuit further comprises a differential integrator stage connected to the at least one output of the edge detection stage, the differential integrator stage configured to derive the loop control voltage from the at least one output of the edge detection stage, wherein the differential integrator stage comprises:

an operational amplifier with a first integrator input;

a second integrator input; and an integrator output, and wherein the first integrator input is connected to a reference voltage and wherein the second integrator input is coupled to the at least one output of the edge detection stage.

2. The analog circuit according to claim 1, wherein the integrator output is connected to the second integrator input via a first local feedback branch.

3. The analog circuit according to claim 2, wherein the first local feedback branch comprises an integration capacitor.

4. The analog circuit according to claim 3, further comprising a second local feedback branch parallel to the first local feedback branch, wherein the second local feedback branch comprises a feedback resistor.

5. The analog circuit according to claim 1, wherein the amplifier stage with continuously variable gain and bandwidth comprises:

an amplifier comprising:

an amplifier input coupled to the signal input via a series input capacitor; and an amplifier output connected to the edge detection stage, the series input capacitor, wherein the series input capacitor is connected between the signal input and the amplifier input;

a first amplifier branch comprising a feedback capacitor parallel with the amplifier; and a second amplifier branch comprising a feedback resistor that is parallel to at least one from among the first amplifier branch and the amplifier.

6. The analog circuit according to claim 5, wherein the feedback resistor is controllable by the loop control voltage.

7. The analog circuit according to claim 6, wherein the feedback resistor is controllable by the loop control voltage derived from the at least one output of the edge detection stage.

8. The analog circuit according to claim 5, wherein at least one from among the series input capacitor and the feedback capacitor is implemented as a varactor or a voltage controlled capacitor, and wherein the loop control voltage is configured to control a bias voltage across the varactor or the voltage controlled capacitor.

9. The analog circuit according to claim 5, wherein the amplifier comprises a bias current control input, and wherein the loop control voltage is configured to control an amount of bias current applied to the bias current control input.

10. A position indicator comprising:

an electrode; and an analog circuit according to claim 1, wherein the signal input of the analog circuit is connected to the electrode, and wherein the electrode is configured to receive the input signal via the capacitive coupling.

11. The position indicator according to claim 10, wherein the electrode is configured to receive the input signal by the electrode capacitive coupling to a capacitive area of an electronic display, the electronic display being outside of the position indicator.

12. An analog circuit comprising:

a signal input configured to provide an input signal via capacitive coupling;

an edge detection stage configured to detect a rising edge and a falling edge of the input signal provided at the signal input; and an amplifier stage with continuously variable gain and bandwidth, the amplifier stage coupled between the signal input and the edge detection stage and configured to amplify the input signal provided by the signal input, wherein the amplifier stage with continuously variable gain and bandwidth is a voltage controllable amplifier stage with continuously variable gain and bandwidth, which is controllable by a loop control voltage derived from at least one output of the edge detection stage, wherein the analog circuit further comprises a differential integrator stage connected to the at least one output of the edge detection stage, the differential integrator stage configured to derive the loop control voltage from the at least one output of the edge detection stage, and wherein the analog circuit further comprises one from among a logic OR gate and a logic NOR gate having a first gate input connected to a first output of the edge detection stage and having a second gate input connected to a second output of the edge detection stage.

13. The analog circuit according to claim 12, wherein the differential integrator stage comprises:

an operational amplifier with a first integrator input;

a second integrator input; and an integrator output, wherein the first integrator input is connected to a reference voltage and wherein the second integrator input is coupled to the at least one output of the edge detection stage, and wherein the one from among the logic OR gate and the logic NOR gate comprises a gate output connected to the second integrator input of the operational amplifier.

14. The analog circuit according to claim 13, further comprising an integration resistor between the second integrator input of the operational amplifier and the gate output of the one from among the logic OR gate and the logic NOR gate.

15. An analog circuit comprising:

a signal input configured to provide an input signal via capacitive coupling;

an edge detection stage configured to detect a rising edge and a falling edge of the input signal provided at the signal input; and an amplifier stage with continuously variable gain and bandwidth, the amplifier stage coupled between the signal input and the edge detection stage and configured to amplify the input signal provided by the signal input, wherein the amplifier stage with continuously variable gain and bandwidth comprises:

an amplifier comprising:

an amplifier input coupled to the signal input via a series input capacitor; and an amplifier output connected to the edge detection stage, the series input capacitor, wherein the series input capacitor is connected between the signal input and the amplifier input;

a first amplifier branch comprising a feedback capacitor parallel with the amplifier; and a second amplifier branch comprising a feedback resistor that is parallel to at least one from among the first amplifier branch and the amplifier, wherein the feedback resistor is controllable by a loop control voltage, wherein the analog circuit further comprises a differential integrator stage connected to at least one output of the edge detection stage, the differential integrator stage configured to derive the loop control voltage from the at least one output of the edge detection stage, wherein the second amplifier branch is connected to an integrator output of the differential integrator stage, and wherein the feedback resistor is controllable by the loop control voltage provided at the integrator output.

* * * * *